US012651615B2

(12) United States Patent
Gustlin et al.

(10) Patent No.: US 12,651,615 B2
(45) Date of Patent: ***Jun. 9, 2026

(54) TEMPERATURE CONTROL FOR MULTIPLE DIE TYPES IN A COMMON PACKAGE

(71) Applicant: Cisco Technology, Inc., San Jose, CA (US)

(72) Inventors: Mark A. Gustlin, Campbell, CA (US); Rakesh Chopra, Menlo Park, CA (US)

(73) Assignee: Cisco Technology, Inc., San Jose, CA (US)

( * ) Notice: Subject to any disclaimer, the term of this patent is extended or adjusted under 35 U.S.C. 154(b) by 140 days.

This patent is subject to a terminal disclaimer.

(21) Appl. No.: 18/435,741

(22) Filed: Feb. 7, 2024

(65) Prior Publication Data

US 2024/0178074 A1 May 30, 2024

Related U.S. Application Data

(63) Continuation of application No. 17/301,058, filed on Mar. 23, 2021, now Pat. No. 11,935,796.

(51) Int. Cl.
*G11C 7/04* (2006.01)
*H01L 21/66* (2006.01)
*H01L 23/473* (2006.01)

(52) U.S. Cl.
CPC ................ *G11C 7/04* (2013.01); *H01L 22/12* (2013.01); *H01L 23/473* (2013.01)

(58) Field of Classification Search
CPC ..... G11C 7/04; G11C 5/04; G11C 2029/0401; G11C 5/025; G11C 29/028; G11C 2029/0409; H01L 22/12; H01L 23/473
USPC ......................................................... 365/211
See application file for complete search history.

(56) References Cited

U.S. PATENT DOCUMENTS

| | | | | |
|---|---|---|---|---|
| 11,935,796 | B2 * | 3/2024 | Gustlin | ................ H01L 23/473 |
| 2006/0179333 | A1 * | 8/2006 | Brittain | .............. G11C 11/4096 |
| | | | | 713/320 |
| 2018/0211900 | A1 * | 7/2018 | Gutala | ..................... G11C 7/04 |
| 2018/0349046 | A1 * | 12/2018 | Yang | ..................... G06F 1/3275 |

* cited by examiner

*Primary Examiner* — Huan Hoang
(74) *Attorney, Agent, or Firm* — Patterson + Sheridan, LLP

(57) ABSTRACT

Techniques for temperature control for multiple dies in an element. A temperature of a first die is measured, in an element including the first die and a second die. The second die includes at least a portion of a controller. The temperature of the first die is changed by adjusting activity, from the second die to the first die, based on a target temperature for the first die and the measured temperature for the first die.

19 Claims, 9 Drawing Sheets

100

104

114A
116
118

MAIN ASIC DIE
112

INTERPOSER

PACKAGE SUBSTRATE

110

130

HBM STACK
114A

HBM STACK
114B

ASIC DIE
112

102

COOLING CONTROLLER
120

400

START

DETERMINE CURRENT HBM TEMPERATURE — 402

DETERMINE CURRENT HBM USAGE — 404

SET SHAPER FOR TRAFFIC TO HBM — 406

END

TEMPERATURE CONTROL FOR MULTIPLE DIE TYPES IN A COMMON PACKAGE

CROSS-REFERENCE TO RELATED APPLICATIONS

This application is a continuation of co-pending U.S. patent application Ser. No. 17/301,058 filed Mar. 23, 2021. The aforementioned related patent application is herein incorporated by reference in its entirety.

TECHNICAL FIELD

Embodiments presented in this disclosure generally relate to temperature control for integrated circuits. More specifically, embodiments disclosed herein relate to temperature control for a co-packaged die for an integrated circuit.

BACKGROUND

Modern routing and switching systems face difficult cooling challenges. For example, these systems often use application-specific integrated circuits (ASICs) that, during operation, generate heat in a small area. Heatsinks, fans, and other techniques can be used to reduce or eliminate this heat. ASICs used in modern routing and switching systems, and in other applications, can include high bandwidth memories (HBMs). HBMs can facilitate, for example, deep packet buffering and very large-scale lookup tables. In some implementations, HBMs can include a stack of multiple dies. Further, multiple HBMs can be co-packaged with an ASIC die. Cooling these varying components can be a significant challenge.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
FIG. 1 illustrates cooling a co-packaged HBM and ASIC die, according to one embodiment.

Embodiments include a method. The method includes measuring a temperature of a first die, in an element including the first die and a second die, where the second die includes at least a portion of a controller. The method further includes changing the temperature of the first die by adjusting a volume of controller traffic transmitted from the second die to the first die, based on a target temperature for the first die and the measured temperature for the first die, where the first die includes a memory and adjusting the volume of controller traffic transmitted from the second die to the first die is further based on an amount of activity at the memory.

Embodiments further include a system. The system includes an element including a first die and a second die, wherein: the second die includes at least a portion of a controller, the element includes a co-packaged die, the first die includes a memory including a plurality of stacked memory dies, and the controller includes an integrated circuit (IC) includes one or more dies. The system further includes a memory storing a program, which, when executed on a processor, performs an operation. The operation includes measuring a temperature of the first die. The operation further includes changing the temperature of the first die by adjusting a volume of controller traffic transmitted from the second die to the first die, based on a target temperature for the first die and the measured temperature for the first die.

Embodiments further include a method. The method includes measuring a temperature of a first die, in an element including the first die and a second die, wherein: the second die includes at least a portion of a controller, the element includes a co-packaged die, the first die includes a memory including a plurality of stacked memory dies, and the controller includes an integrated circuit (IC) including one or more dies. The method further includes determining an activity level from the second die to the first die, and controlling a cooling element for the first die, based on the measured temperature of the first die and the activity level from the second die to the first die.

EXAMPLE EMBODIMENTS

As discussed above, a routing or switching component (or another integrated circuit (IC) component) can include two types of die in a common package: one or more ASICs and one or more HBM stacks. In an embodiment, the ASIC and the HBM stack can thermally cross-contaminate each other. For example, an ASIC die is commonly larger and more power-hungry than an HBM. When the ASIC die heats up, it also heats up the HBM stack, even if the HBM stack is not, itself, dissipating much power (e.g., when the HBM stack does not have much activity). The HBM in turn minimally heats up the ASIC die when it dissipates power. In an embodiment, the ratio of power dissipated is on the order of 10:1—that is, the ASIC die dissipates approximately 10 times as much power as the HBM stack.

Further, in an embodiment, the ASIC die and the HBM stack may have differing maximum (i.e., high) operating temperatures. For example, the ASIC die may have a short-term maximum temperature of 125° C., and may be able to operate at a long term temperature limit (e.g., above 105° C.

or 110° C.) for a limited duration. On the other hand, the HBM may have a short-term maximum temperature of 105° C., and a long-term limit of 95° C. In addition, the thermal resistance to dissipate heat through the HBM stack (e.g., a 5 or 9 die high stack) is typically higher than the thermal resistance to dissipate heat through the ASIC, due to the thermal impedance of the HBM stack itself (e.g., before reaching the thermal interface material (TIM1) and ultimately the heatsink). In an embodiment, an HBM stack can include a logic die with multiple additional dies stacked on top of the logic die (e.g., a logic die with four additional dies or a logic die with 8 additional dies).

These challenges make it difficult to manage cooling for the common package (e.g., in a routing or switching component or another suitable component). For example, one or more fans can be used for cooling, but it is difficult to manage the fan speed(s) to provide adequate cooling for both the ASIC die and the HBM stack, under varying usage (e.g., traffic) conditions, while also reducing the power footprint of the system (which normally means reducing the fan speed).

In an embodiment, one solution is to run the fans fast enough to be confident that the main die and HBM die stacks are always cooled well enough, even under the worst-case activity scenarios (e.g., worst-case traffic conditions). But that is very pessimistic and can waste significant power. For example, in a large chassis a 20% increase in fan speed can cost as much as 2500 W of power. Since the fans will be spinning much faster than needed for typical or lightweight use cases, this is a significant drawback. In an embodiment, another solution for dealing with overheating HBM is to shut down the access to the HBM altogether. But this can have a large impact on users.

In an embodiment, one or more techniques disclosed herein relate to advanced temperature control that considers, for example, the history of the device and what temperatures it has been run at, the ambient temperature, and the current running junction temperature. This can be used to improve control of the fan to both ensure the ASIC and HBM dies are sufficiently cooled, and reduce power consumption.

In an embodiment, management of the ASIC die and HBM die stack temperature can be broken into several techniques. First, the temperature of the HBM stack can be allowed to increase above the HBM die stack's long term temperature limit for part of its projected lifetime (if applicable). This can be done, for example, with a window algorithm, while still maintaining device integrity. This is discussed further below with regard to FIG. 3.

Second, a shaper algorithm can be used to ensure that the activity to the HBM is limited enough to prevent exceeding the target temperature (e.g., the short term maximum or the long term temperature limit) under the current operating conditions. This is discussed further below with regard to FIG. 4. Third, the current fan speed(s) can be continuously analyzed to ensure that the HBM has enough temperature headroom so that it can continue to be used. The fan speed can be increased or decreased, as appropriate. This is discussed further below with regard to FIG. 5.

FIG. 1 illustrates cooling a co-packaged HBM and ASIC die, according to one embodiment. A system 100 includes multiple elements, including a co-packaged die 110. In an embodiment the system 100 is a routing or switching system (e.g., for an electronic communication network). This is merely one example, and the system 100 can be any suitable electronic system (e.g., a silicon photonics electronic system) including any suitable elements.

As illustrated by top-down view 102, the co-packaged die 110 includes an ASIC die 112 and two HBM stacks 114A and 114B. A side view 104 further illustrates the same ASIC die 112 along with an HBM stack 114A. The side view 104 further illustrates an interposer 116 and a package substrate 118. The interposer 116 is merely one example packaging technique, and any suitable technique can be used (e.g., integrated fan out (InFO), chip-on-wafer-on-substrate (CoWoS), or any other suitable technique).

As discussed above, in an embodiment the ASIC die 112 is an ASIC for a routing or switching system, or for any other suitable system. The co-packaged die 110 can include any suitable number of HBM stacks 114A-N. The illustrated two HBM stacks 114A and 114B are merely examples. Further, each HBM stack 114A-N can include a number of individual dies (e.g., 5 dies or 9 dies). This is merely an example, and any suitable number of individual dies can be used.

The system 100 further includes a cooling controller 120 and a cooling element 130. In an embodiment, the cooling element 130 is a system fan used for cooling the co-packaged die 110. While the cooling element 130 is illustrated as one fan, any suitable number of fans can be used. Further, a fan is merely one example of a cooling element that can be used to cool the co-packaged die 110. As discussed herein, any suitable cooling element can be used, including a liquid cooling element. In an embodiment, the cooling controller 120 acts to control the cooling element 130 to cool the co-packaged die 110. For example, the cooling controller 120 can control the cooling properties of the cooling element 130 (e.g., fan speed of a fan), based on temperature readings from the co-packaged die 110. This is discussed further with regard to subsequent figures.

Figure 2:
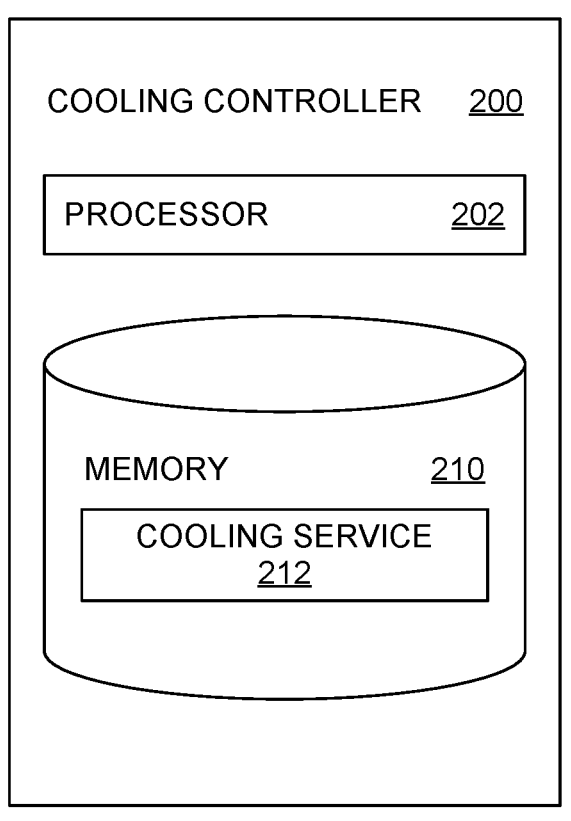
FIG. 2 is a block diagram illustrating a cooling controller for cooling a co-packaged HBM and ASIC die, according to one embodiment.

FIG. 2 is a block diagram illustrating a cooling controller 200 for cooling a co-packaged HBM and ASIC die, according to one embodiment. In an embodiment, the cooling controller 200 corresponds with the cooling controller 120 illustrated in FIG. 1. The cooling controller 200 includes a processor 202 and a memory 210. The processor 202 generally retrieves and executes programming instructions stored in the memory 210. The processor 202 is representative of a single central processing unit (CPU), multiple CPUs, a single CPU having multiple processing cores, graphics processing units (GPUs) having multiple execution paths, and the like.

Although the memory 210 is shown as a single entity, the memory 210 may include one or more memory devices having blocks of memory associated with physical addresses, such as random access memory (RAM), read only memory (ROM), flash memory, or other types of volatile and/or non-volatile memory. The memory 210 generally includes program code for performing various functions related to use of the cooling controller 200. The program code is generally described as various functional "applications" or "modules" within the memory 210, although alternate implementations may have different functions and/ or combinations of functions. Within the memory 210, the cooling service 212 manages cooling for a co-packaged die (e.g., the co-packaged die 110 illustrated in FIG. 1), or any other suitable IC or electronic component.

Figure 3:
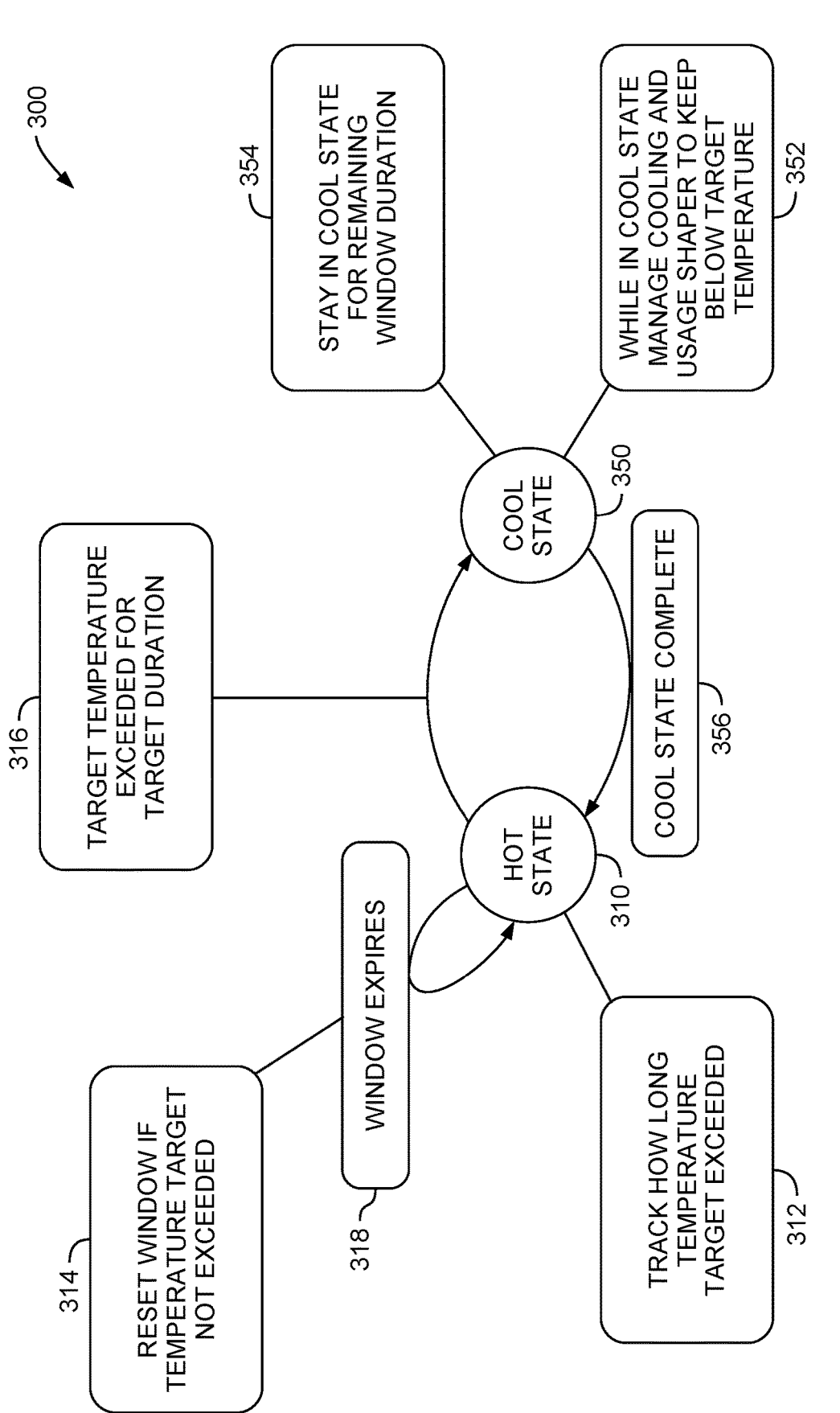
FIG. 3 is a diagram illustrating cooling a co-packaged die, according to one embodiment.

FIG. 3 is a diagram 300 illustrating cooling a co-packaged die, according to one embodiment. In an embodiment, FIG. 3 corresponds with a window algorithm used for the first technique described above: allowing the temperature of the HBM stack to increase above the HBM die stack's long term temperature limit for part of its projected lifetime, while still maintaining device integrity.

As illustrated, control logic for the HBM (e.g., the cooling service 212 illustrated in FIG. 2) includes two states: a hot state 310 and a cool state 350. As discussed above, in an embodiment an HBM can have a target maximum short term temperature limit which it may not exceed (e.g., 105° C.) and a target long term temperature limit (e.g., 95° C.) which it is allowed to exceed only for a fraction of its operating life. For example, an HBM may be allowed to operate above its target long term temperature limit (e.g., above 95° C.) for 5% of its operating life. This is merely one example, and other values may apply.

In an embodiment, the techniques illustrated in FIG. 3 regulate the duration during which the HBM is permitted to exceed its target long term temperature limit. During the hot state 310, the HBM is allowed to exceed its target long term temperature limit (e.g., 95° C.), and during the cool state 350 the temperature of the HBM is regulated (e.g., using cooling and activity shaping) to stay at or below the target long term temperature limit.

Assume control logic for the HBM begins in the hot state 310. A cooling service (e.g., the cooling service 212 illustrated in FIG. 2) maintains a window duration for tracking the ratio of operating time at which the HBM exceeds its target long term temperature limit. For example, as discussed above, an HBM could be permitted to exceed its target long term temperature limit for 5% of its operating life. The cooling service could maintain a 20 day window, and ensure that the HBM exceeds its target long term temperature limit for no more than 1 day within a given 20 day window (i.e., no more than 5% of the window). Further, while in the hot state 310 the cooling service maintains the HBM at a temperature below the allowed maximum short term temperature limit (e.g., below 105° C.) at all times. These are merely examples, and other suitable values could be used.

At block 312 the cooling service tracks how long the temperature target has been exceeded. As discussed above, in one example the HBM is permitted to exceed the temperature target for up to 1 day in a given 20 day window. The cooling service uses the time tracked at block 312 to determine whether to remain in the hot state or to transition to the cool state. For example, at block 316, the cooling service determines that the HBM has been in the hot state and has exceeded the temperature target for the target duration, and transitions to the cool state 350. Using example values, the cooling service determines that the HBM has exceeded 95° C. for 1 day (i.e., 1440 minutes), and then transitions to the cool state 350.

Alternatively, the window (e.g., the 20 day window) may pass without the HBM exceeding the allotted time above the target long term temperature limit (e.g., with less than 1 day above 95° C.). At block 318, the cooling service determines that the window (e.g., the 20 day window) has expired, and at block 314, the cooling service determines that the HBM has not exceeded its target long term temperature limit for the target duration (e.g., the HBM has exceeded 95° C. for less than 1 day). The cooling service then resets the window (e.g., resets the 20 day window), and the control logic stays in the hot state 310.

In an embodiment, while in the cool state 350 the temperature of the HBM is maintained at or below the target long term temperature limit (e.g., at or below 95° C.). At block 352, the cooling service maintains the temperature of the HBM at or below the target long term temperature limit. Further, in an embodiment, the cooling service can maintain the temperature of the HBM at a target average temperature that is at or below the target long term temperature limit (e.g., 95° C.). That is, in one embodiment, the cooling service can maintain the HBM at a target average temperature. Alternatively, or in addition, the cooling service can maintain the HBM at any temperature at or below the target long term temperature limit (e.g., any temperature at or below 95° C.).

In an embodiment, the cooling service uses a combination of increased cooling (e.g., increased fan speed) and activity shaping (e.g., directing less activity from an ASIC to the HBM) to maintain the temperature of the HBM at or below the target long term temperature limit. Alternatively, the cooling service uses one of these, but not both (e.g., increased cooling or activity shaping, but not both).

At block 354, the cooling service maintains the HBM in the cool state 350 for the remaining window duration (e.g., the remaining duration of the current 20 day window). For example, if the HBM was maintained in the hot state 310 for 10 days before transitioning to the cool state, the cooling service maintains the HBM in the cool state 350 for the remaining 10 days. After the current window expires, at block 356 the cooling service transitions the HBM back to the hot state 310.

Further, in an embodiment, at block 354 the cooling service can determine to maintain the HBM in the cool state 350 for longer than the remaining window. For example, if the HBM temperature in the cool state 350 exceeds the target temperature, despite efforts to lower the temperature, the cooling service can determine to extend the window and maintain the HBM in the cool state 350 for a longer duration. This can ensure that the HBM stays at the desired temperature for the desired fraction of its lifetime.

Further, in an embodiment, the cooling service can consider data across windows. For example, the cooling service could determine that the HBM operated above the target long term temperature limit for longer than the preferred duration (e.g., as part of an error) in a given window, and could extend time in the cool state 350, in the next window, to compensate.

An example may be instructive. Assume that an HBM has a long term temperature limit of 95° C. and a requirement that the HBM stay at or below the long term temperature limit for 95% of its life. The cooling service can set a window of 20 days, and a target duration of 1 day for the hot state to be above the long term temperature limit (i.e., to allow a maximum of 5% of time above the long term temperature limit).

The HBM enters the hot state 310. 10 days pass. The cooling service determines, at block 316, that the HBM has been above 95° C. for at least one day (e.g., cumulatively across the 10 days). The cooling service transitions to the cool state 350. At block 352, the cooling service uses cooling and activity shaping to lower the temperature of the HBM and maintain a temperature at or below 95° C. At block 354, the cooling service maintains the temperature of the HBM for the remaining 10 days of the window.

After the 10 days pass the cooling service determines that, despite the cooling and activity shaping, the HBM has not maintained a temperature at or below 95° C. The cooling service extends the window (e.g., for longer than 20 days total) and maintains the HBM in the cool state 350 for as long as is necessary to ensure the HBM remains at or below the target temperature of 95° C. for 95% of its life. At block 356, the HBM then transitions back to the hot state 310.

Figure 4:
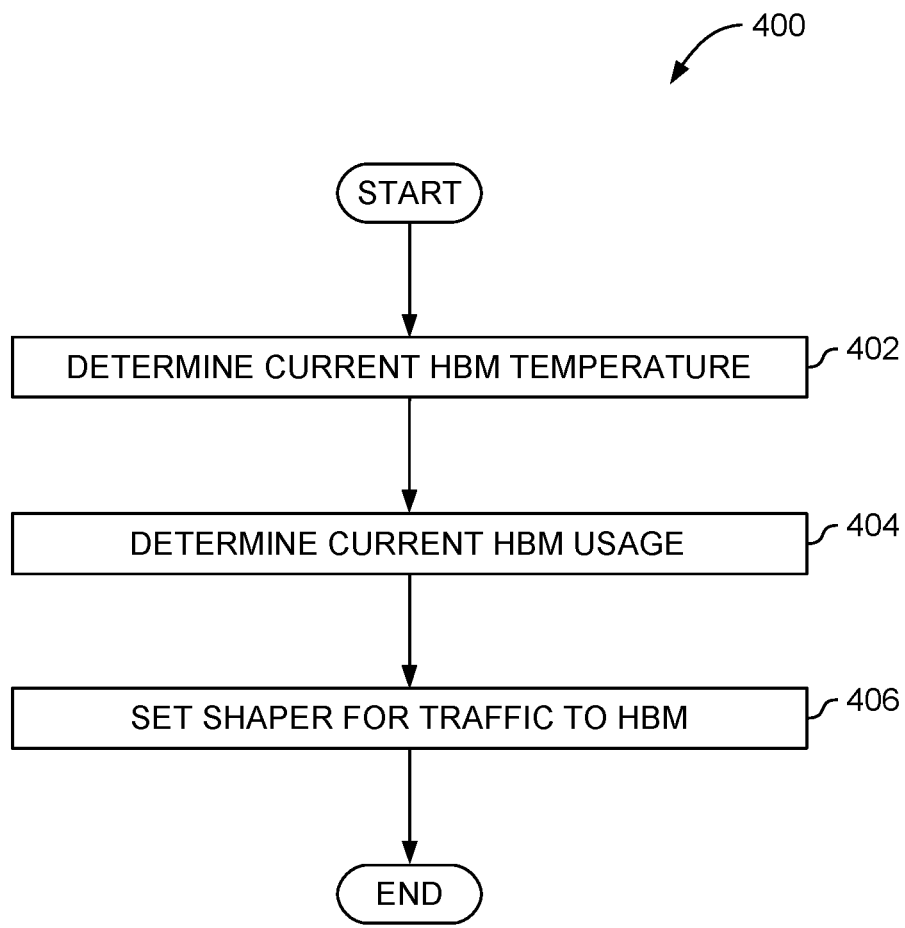
FIG. 4 is a flowchart illustrating shaping activity to an HBM for cooling a co-packaged die, according to one embodiment.

FIG. 4 is a flowchart 400 illustrating shaping activity to an HBM for cooling a co-packaged die, according to one embodiment. In an embodiment, FIG. 4 corresponds with the second technique described above: using a shaper algorithm to ensure that the activity to the HBM is limited enough to prevent exceeding the target temperature under the current operating conditions. In an embodiment, this algorithm can be run at a high frequency (e.g., every 5-10 seconds) since the HBM temperature can increase quickly.

At block 402 a cooling service (e.g., the cooling service 212 illustrated in FIG. 2) determines the current HBM temperature (e.g., the current running junction temperature). At block 404, the cooling service determines the current HBM usage (e.g., the current bandwidth allocated to the HBM by the ASIC). At block 406, the cooling service sets a shaper for activity to the HBM to limit the HBM usage and prevent exceeding temperature limits.

In an embodiment, the cooling service can use the following equation to set the shaper: ACTIVITY_SET_POINT=(HBM_MAX_TEMP−HBM_CURRENT_TEMP)*SLOPE_ACTIVITY_vs_TEMP+CURRENT_HBM_ACTIVITY. In this equation, ACTIVITY_SET_POINT represents the set point for HBM activity (e.g., HBM bandwidth allocation) for the traffic shaper. HBM_MAX_TEMP represents the maximum short-term temperature limit for the HBM (e.g., 105° C. as discussed above with regard to FIG. 3). In an embodiment, HBM_MAX_TEMP (e.g., 105° C.) can be replaced with HBM_LONG_TERM_LIMIT (e.g., 95° C.), as discussed above with regard to FIG. 3.

HBM_CURRENT_TEMP represents the current HBM temperature (e.g., determined at block 402). SLOPE_ACTIVITY_vs_TEMP represents the slope of an equation that relates the HBM traffic (e.g., bandwidth allocation) to the temperature of the HBM. In an embodiment, this is used to extrapolate how traffic changes affect the temperature of the HBM die. CURRENT_HBM_ACTIVITY represents how much of the available bandwidth for the HBM is currently being used (e.g., what percentage of HBM bandwidth is being used).

For example, assume HBM_MAX_TEMP is 105, HBM_CURRENT_TEMP is 93, SLOPE_ACTIVITY_vs_TEMP is 5, and CURRENT_HBM_ACTIVITY is 15. The ACTIVITY_SET_POINT=(105−93)*5+15=75. The cooling service can set the activity shaper to allot traffic up to 75% of the HBM available bandwidth. Similarly, if HBM_LONG_TERM_LIMIT of 95 is used in place of HBM_MAXIMUM_TEMP, ACTIVITY_SET_POINT=(95-93)*5+15=25. The cooling service can set the activity shaper to allot traffic up to 25% of the HBM available bandwidth. In an embodiment, a proportional-integral-derivative (PID) controller can be used to smoothly change the bandwidth allocated to the HBM.

Figure 5:
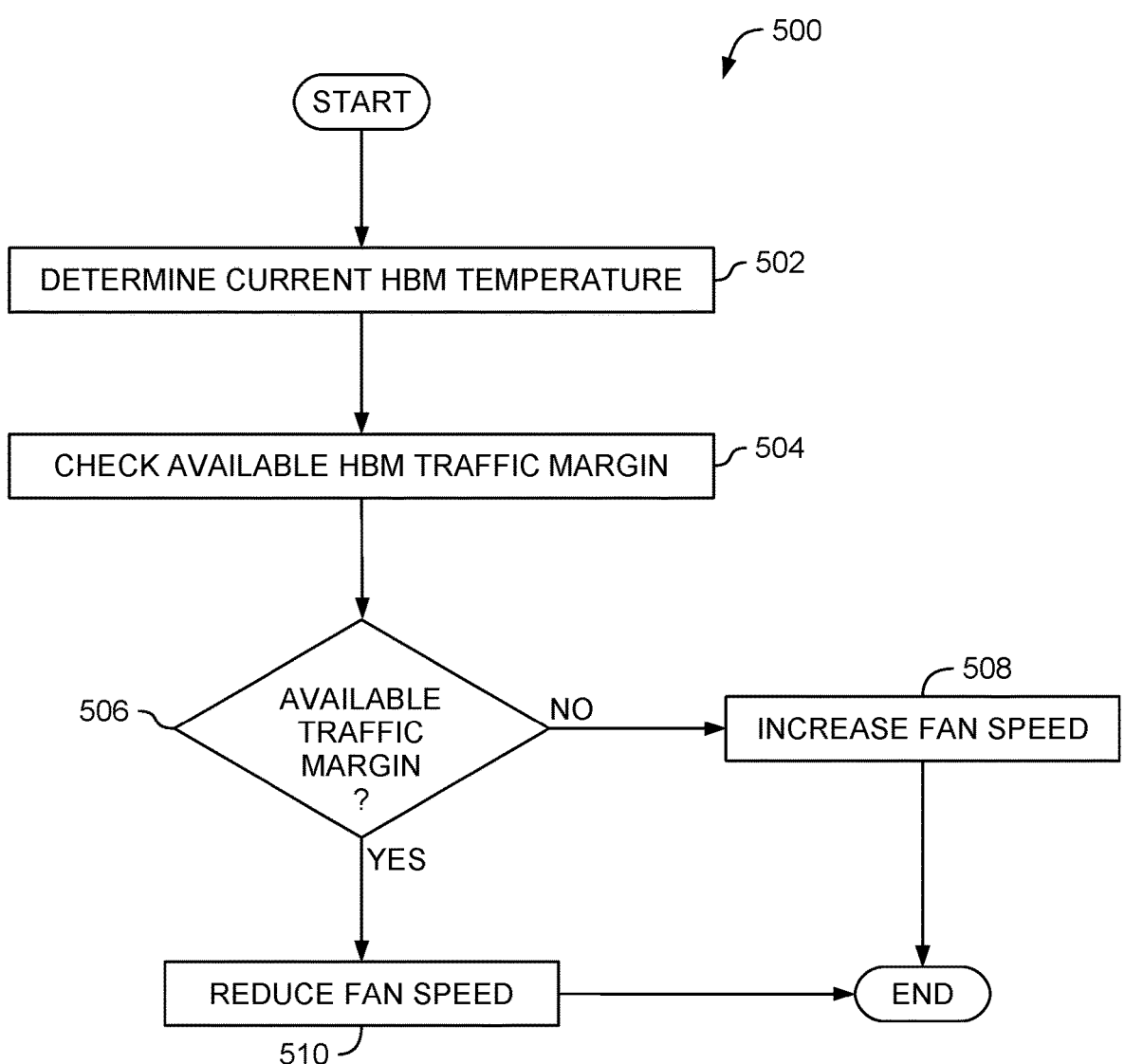
FIG. 5 is a flowchart illustrating controlling fan speed for cooling a co-packaged die, according to one embodiment.

FIG. 5 is a flowchart 500 illustrating controlling fan speed for cooling a co-packaged die, according to one embodiment. In an embodiment, FIG. 5 corresponds with the third technique described above: controlling the fan speed to ensure that the HBM has enough temperature headroom so that it can continue to be used. In an embodiment, this algorithm is run less frequently than the shaper algorithm illustrated in FIG. 4 (e.g., once per minute), to avoid changing the fan speed too frequently. For example the fan may have a ramp-up time to change its speed of operation, and so it can be undesirable to change the speed too frequently. As discussed above, a fan is merely one example of a cooling element and any suitable cooling element can be used (e.g., liquid cooling).

At block 502 a cooling service (e.g., the cooling service 212 illustrated in FIG. 2) determines the current HBM temperature. At block 504, the cooling service determines the available HBM activity margin (e.g., the amount of bandwidth available to be used in addition to the bandwidth currently used by the HBM). At block 506, the cooling service determines whether the HBM has available activity margin. If not, the flow proceeds to block 508 and the cooling service increases the fan speed (e.g., to increase cooling to the HBM and allow more activity allocation). If so, the flow proceeds to block 510 and the cooling service decreases fan speed (e.g., to avoid wasting power on excess fan speed since the HBM is operating with available activity margin).

In an embodiment, the techniques illustrated in FIG. 5 allow for a balance between power consumption and performance. In an embodiment, the cooling service can determine a set point for the fan speed using the following equation: FAN_SET_POINT=HBM_MAX_TEMP−(HBM_BUFFER*HBM_TEMP_CONST). In this equation, FAN_SET_POINT represents the target temperature for HBM after it is cooled by the fan. In an embodiment, a PID controller can be used to smoothly adjust the fan speed until the HBM reaches the target temperature.

HBM_MAX_TEMP represents the maximum short-term temperature limit for the HBM (e.g., 105° C. as discussed above with regard to FIG. 3). In an embodiment, HBM_MAX_TEMP (e.g., 105° C.) can be replaced with HBM_LONG_TERM_LIMIT (e.g., 95° C.), as discussed above with regard to FIG. 3.

HBM_BUFFER represents a constant set to an activity buffer for how much HBM activity (e.g., bandwidth) to leave available for bursts. For example, the HBM_BUFFER can be set to 50%. This would signify that the fan should be set to allow at least 50% more HBM activity than is currently being used to enter the HBM memory. In an embodiment, setting HBM_BUFFER high can impact power usage, while setting it low can impact device performance (e.g., resulting in dropped packets if the HBM is used in network switch or router). HBM_TEMP_CONST is a constant set to the temperature swing. For example, HBM_TEMP_CONST can be a pre-determined measured value (e.g., based on testing) relating to the temperature swing needed to get to full fan operation.

For example, assume HBM_MAX_TEMP is 105, HBM_LONG_TERM_LMIT is 95, HBM_BUFFER is 0.5 (e.g., 50%), and HBM_TEMP_CONST is 25. The FAN_SET_POINT=105-(0.5*25)=92.5. In an embodiment, the fan speed is modified (e.g., using a PID controller as discussed above) to change the HBM temperature to 92.5° C. In an embodiment, HBM_LONG_TERM_LIMIT (e.g., 95° C.) can be used in place of HBM_MAXIMUM_TEMP (e.g., 105° C.). Further, in an embodiment, the cooling service can take into account how much HBM activity is currently allocated (e.g., to make sure the fan is not run at a wastefully high speed). For example, if 80% of the HBM bandwidth is currently being used, there is no need to allow for a buffer of 50% more bandwidth and the amount of fan speed can be capped.

Figure 6A:
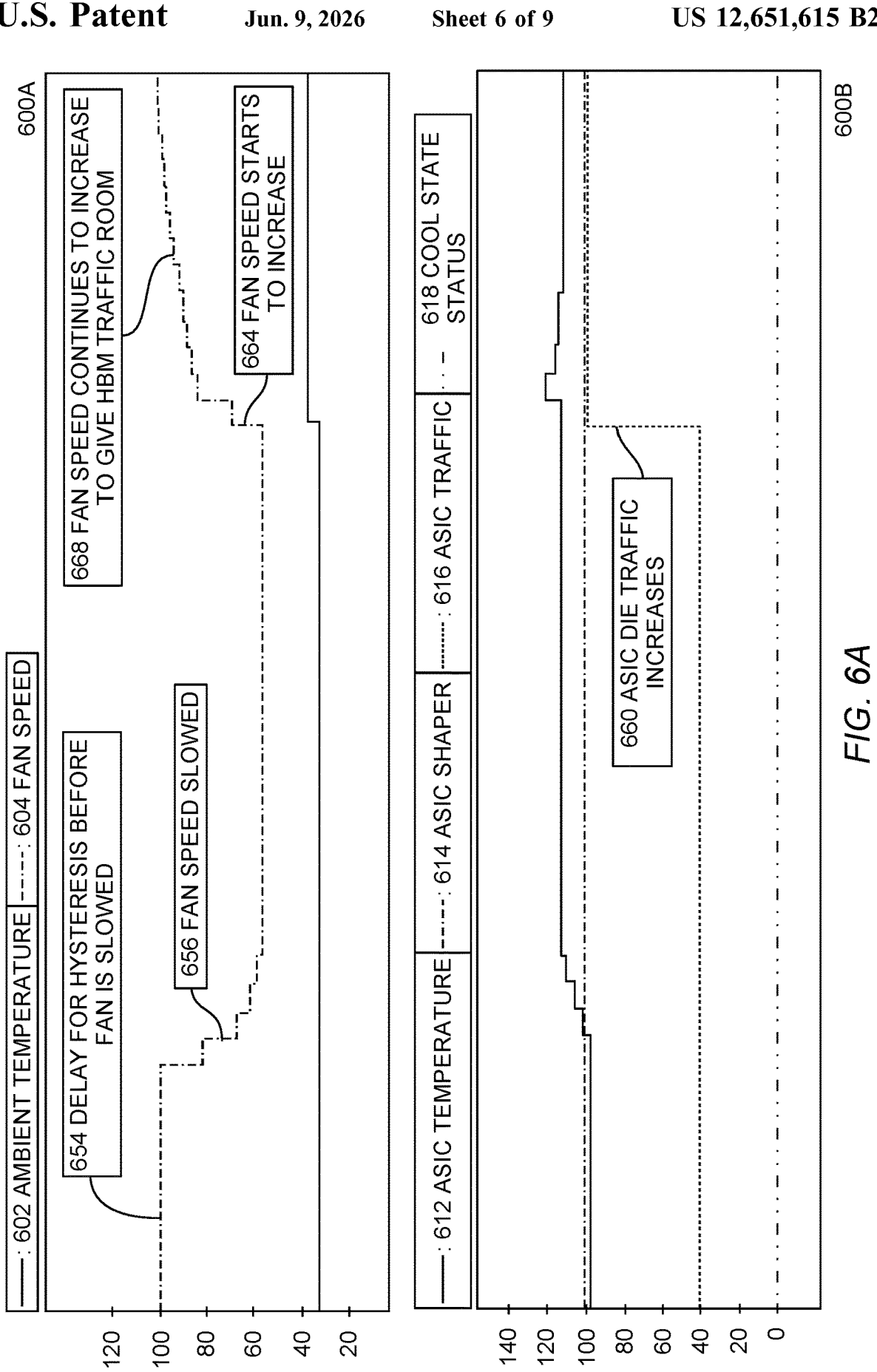
FIG. 6A illustrates simulated HBM cooling controls in a hot state, according to one embodiment.
Figure 6B:
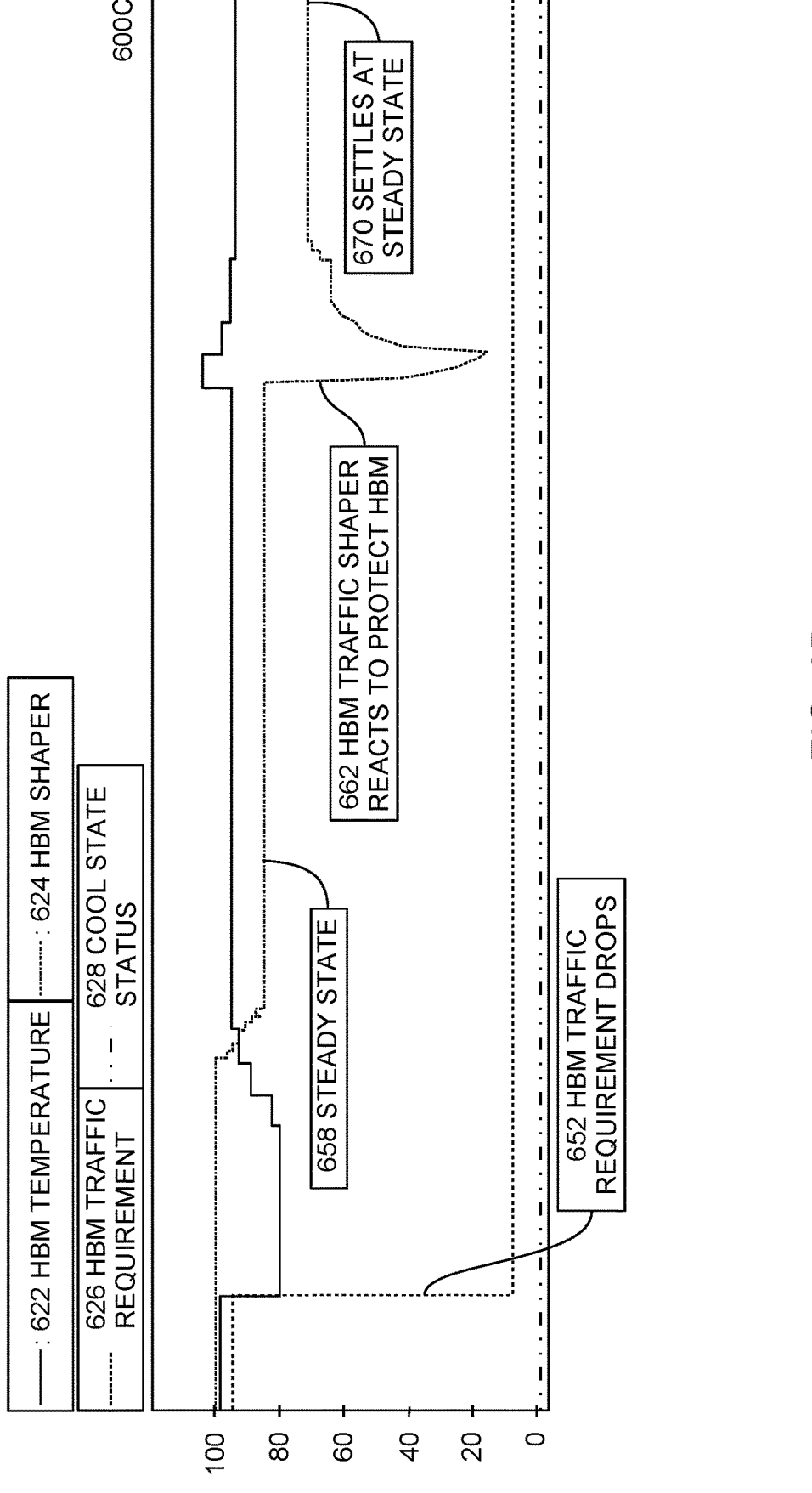
FIG. 6B further illustrates simulated HBM cooling controls in a hot state, according to one embodiment.

FIGS. 6A-B illustrate simulated HBM cooling controls in a hot state, according to one embodiment. In an embodiment, FIGS. 6A-B represent a simulation of techniques discussed above with regard to FIGS. 3-5 for an example network router or switch with a co-packaged die including an ASIC die and an HBM die stack (e.g., as illustrated in FIG. 1). FIGS. 6A_B illustrate three graphs 600A, 600B, and 600C that are parallel in time and represent different measurements. A top graph, 600A, illustrates a line 602 representing ambient temperature and a line 604 representing fan speed. A middle graph, 600B, illustrates a line 612 representing ASIC temperature, a line 614 representing an ASIC traffic shaper, a line 616 representing ASIC traffic, and a line 618 representing a cool state status for the ASIC. A bottom graph, 600C, illustrates a line 622 representing HBM temperature, a line 624 representing an HBM traffic shaper, a line 626 representing an HBM traffic requirement, and a line 628 representing the cool state status for the HBM (e.g., whether the ASIC is operating in a cool state or a hot state, as discussed above with regard to FIG. 3). In FIGS. 6A-B, the HBM cooling controls are in a hot state, and so the line 628 is set to low.

At 652, the HBM traffic requirement drops (e.g., as illustrated by the line 626 in the graph 600C). This could, in an embodiment, result in an immediate drop in fan speed to conserve power in light of the lower HBM traffic requirement. At 654 however, in an embodiment, the fan speed drop is delayed for hysteresis. In an embodiment, the fan speed drop is delayed for a set period of time (e.g., 5 minutes). At 656 the fan speed is slowed in response to the HBM traffic drop and the HBM temperature drop illustrated by line 622. In an embodiment, this can be governed by the equation discussed above with regard to FIG. 5. Further, in an embodiment, slowing the fan conserves power.

At 658 the HBM shaper reaches a steady state. For example, the illustrated short term maximum temperature limit for the HBM is 105° C., the illustrated slope of traffic versus temperature is 7 and the illustrated current HBM traffic is 8. The HBM shaper reaches a steady state of 85% to maintain the HBM at a temperature of approximately 94° C. This can be shown with the equation described above with regard to FIG. 4: (HBM_MAX_TEMP−HBM_CUR-RENT_TEMP)*SLOPE_TRAFFIC_vs_TEMP+CURRENT_HBM_TRAFFIC=TRAFFIC_SET_POINT. Using the example values: (105−94)*7+8=85.

At 660 the ASIC die traffic increases (e.g., to 100% of capacity). This is illustrated with the line 616. At 662, the HBM traffic shaper (illustrated with the line 624) reacts by lowering the traffic allocated to the HBM, to protect the HBM from overheating. At 664 the fan speed starts to increase (e.g., as a result of the ASIC die traffic increase at 660). At 668, the fan speed continues to increase to allow the HBM room for additional future traffic allocation.

At 670, the HBM shaper settles at a steady state. For example, the illustrated HBM shaper settles at a steady state of approximately 71%. Using the equation discussed above: (105−96)*7+8=71%. This steady state is lower than the steady state at 658 because, for example, running the fan at 100% leaves the HBM temperature at 96° C. (above the long term temperature limit of 95° C.), and so the HBM traffic shaper compensates by allocating less traffic to the HBM.

Figure 7A:
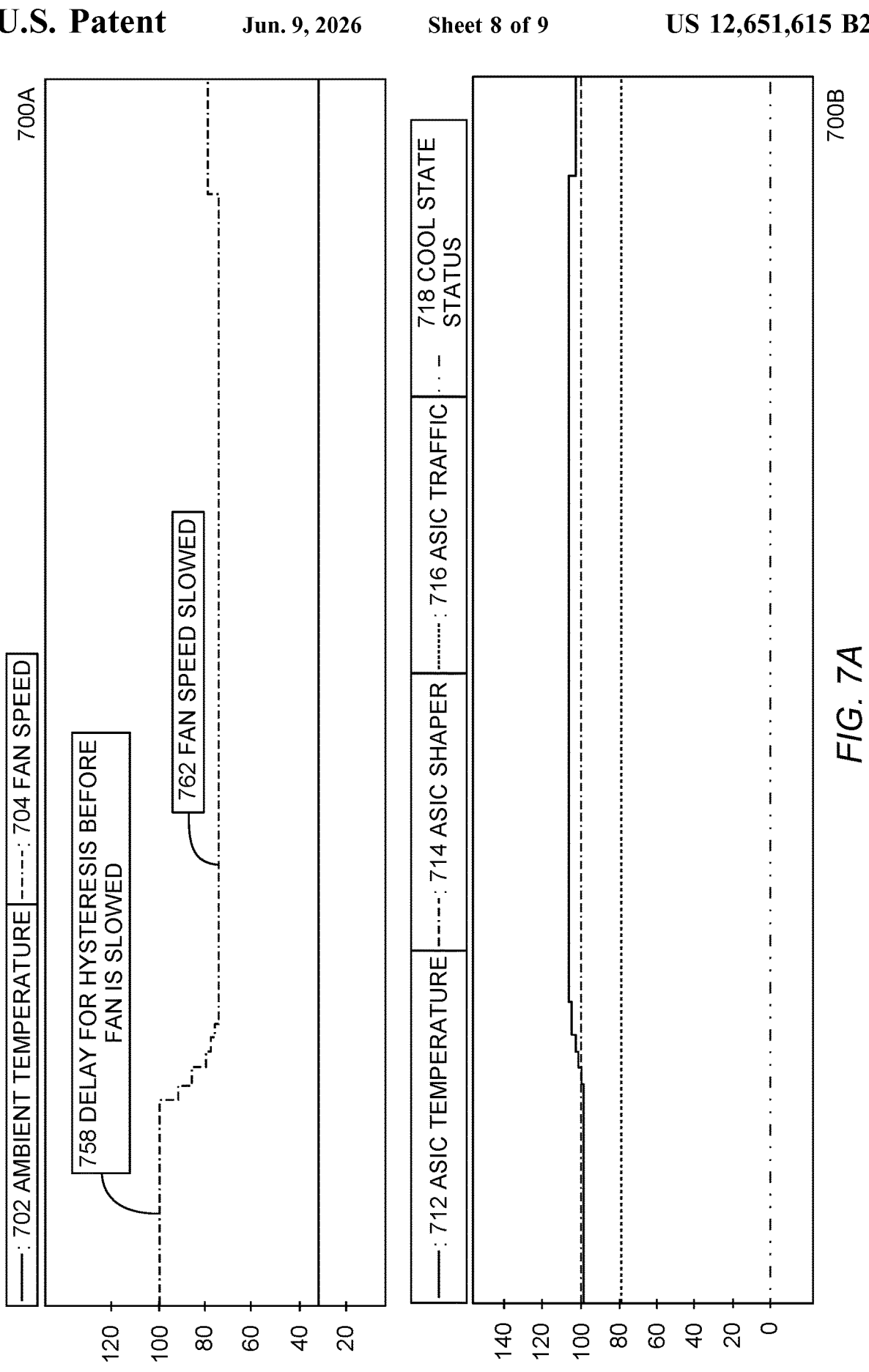
FIG. 7A illustrates simulated HBM cooling controls in a cool state, according to one embodiment.
Figure 7B:
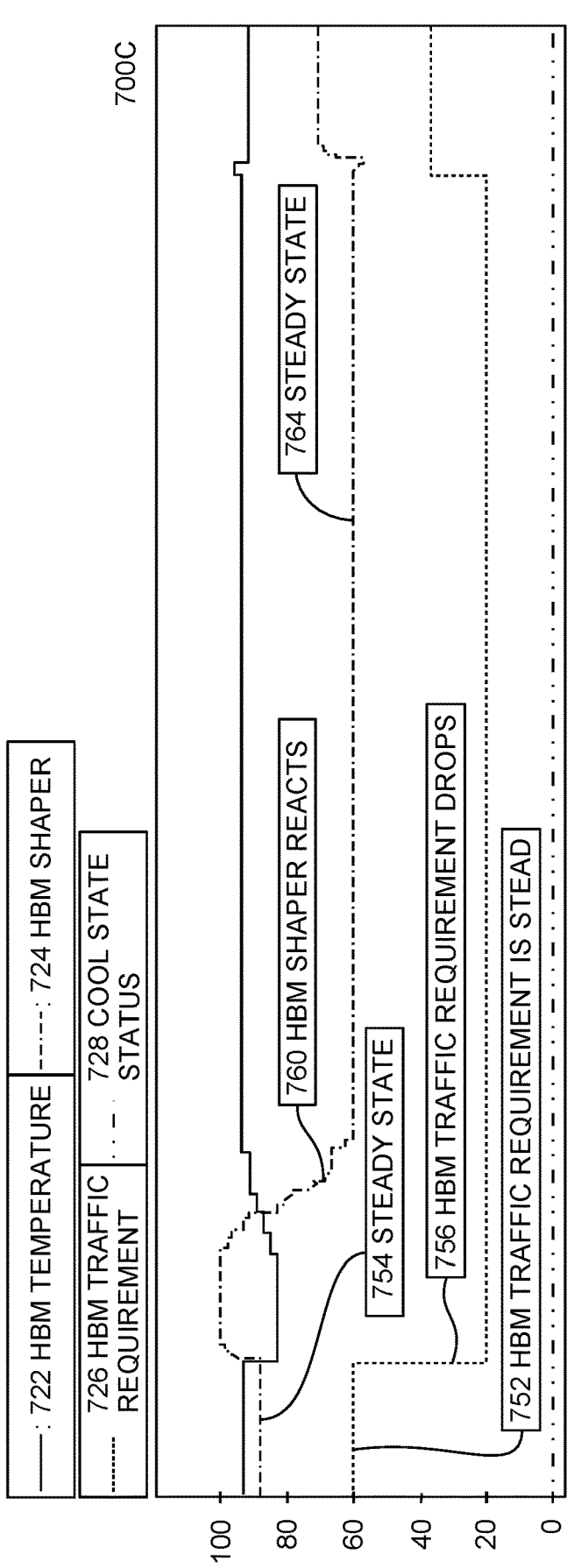
FIG. 7B further illustrates simulated HBM cooling controls in a cool state, according to one embodiment.

FIGS. 7A-B illustrate simulated HBM cooling controls in a cool state, according to one embodiment. In an embodiment, FIGS. 7A-B, like FIGS. 6A-B, represents a simulation of techniques discussed above with regard to FIGS. 3-5 for an example network router or switch with a co-packaged die including an ASIC die and an HBM die stack (e.g., as illustrated in FIG. 1). FIGS. 7A-B represent a cool state for the HBM cooling controls, as illustrated in FIG. 3.

FIGS. 7A-B illustrate three graphs 700A, 700B, and 700C that are parallel in time and represent different measurements. A top graph, 700A, illustrates a line 702 representing ambient temperature and a line 704 representing fan speed. A middle graph, 700B, illustrates a line 712 representing ASIC temperature, a line 714 representing an ASIC traffic shaper, a line 716 representing ASIC traffic, and a line 718 representing a cool state status for the ASIC. A bottom graph, 700C, illustrates a line 722 representing HBM temperature, a line 724 representing an HBM traffic shaper, a line 726 representing an HBM traffic requirement, and a line 728 representing the cool state status for the HBM (e.g., whether the ASIC is operating in a cool state or a hot state, as discussed above with regard to FIG. 3). In FIGS. 7A-B, the HBM cooling controls are in a cool state, and so the line 728 is set to high.

At 752, the HBM traffic requirement is steady (e.g., at approximately 58%). At 754, the HBM traffic shaper is also in a steady state. For example, the illustrated long term temperature limit for the HBM is 95° C., the illustrated slope of traffic versus temperature is 7 and the illustrated current HBM traffic is 58. The HBM shaper reaches a stead state of 86% to maintain the HBM at a temperature of approximately 94° C. This can be shown with the equation described above with regard to FIG. 4: (HBM_LONG_TERM_LIMIT−HBM_CURRENT_TEMP)*SLOPE_TRAF-FIC_vs_TEMP+CURRENT_HBM_TRAFFIC=TRAFFIC_SET_POINT. Using the example values: (95−91)*7+58=86.

At 756, the HBM traffic requirement drops (e.g., to approximately 19%). This could, in an embodiment, result in an immediate drop in fan speed to conserve power in light of the lower HBM traffic requirement. At 758 however, in an embodiment, the fan speed drop is delayed for hysteresis. In an embodiment, the fan speed drop is delayed for a set period of time (e.g., 5 minutes).

At 760, the HBM shaper reacts to the decreased HBM traffic requirement. At 762 the fan speed is eventually slowed. In an embodiment, this can be governed by the equation discussed above with regard to FIG. 5. Further, in an embodiment, slowing the fan conserves power. At 764, the HBM shaper again reaches a steady state. Using the equation discussed above: (95−88)*7+19=68%. Thus, the HBM traffic shaper acts to allocate 68% of traffic to the HBM.

As discussed above, the techniques illustrated with regard to FIGS. 3-7 can be used with a co-packaged die with two die types (e.g., an ASIC and HBM die stack). This is merely an example, and these techniques can also be applied to a co-packaged die with more than two die types. In this scenario, for example, different window types could be used for different die types (e.g., modifying FIG. 3). Further, the shaper techniques disclosed with regard to FIG. 4, and the fan control techniques disclosed with regard to FIG. 5, can be suitable modified for more than two die types. In addition, the disclosure of an ASIC and HBM die stack in a communication network router or switch is merely one example. These techniques could be used with any suitable co-packaged die, including a Silicon Photonics application (e.g., a co-packaged laser with another die) or any other suitable application.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function (s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method, comprising:
measuring a temperature of a first die, in an element comprising the first die and a second die, wherein the second die comprises at least a portion of a controller;
changing the temperature of the first die by adjusting a volume of controller traffic transmitted from the second die to the first die based on a target temperature for the first die and the measured temperature for the first die, wherein the first die comprises a memory and adjusting the volume of controller traffic transmitted from the second die to the first die is further based on an amount of activity at the memory.

2. The method of claim 1, wherein the element comprises a co-packaged die, the first die comprises a memory comprising a plurality of stacked memory dies, and the controller comprises an integrated circuit (IC) comprising one or more dies.

3. The method of claim 2, wherein the element relates to at least one of a communication network router or switch, and wherein the memory comprises a high bandwidth memory (HBM).

4. The method of claim 2, wherein the adjusting the volume of controller traffic transmitted from the second die to the first die is further based on a slope of an equation relating activity of the memory to temperature of the memory.

5. The method of claim 1, further comprising:
controlling a cooling element for the first die, based on the measured temperature of the first die and an activity level from the second die to the first die.

6. The method of claim 5, wherein the cooling element comprises at least one of: (i) a fan, or (ii) a liquid cooling element, and wherein controlling the cooling element for the first die comprises:

increasing cooling from the cooling element to allow the first die room for additional future traffic allocation from the second die.

7. The method of claim 1, further comprising:

determining the target temperature based on a duration of time at which the first die has exceeded a first temperature limit.

8. The method of claim 7, wherein determining the target temperature based on the duration of time at which the first die has exceeded the first temperature limit comprises at least one of:

determining that the first die has exceeded the first temperature limit for longer than a duration of time, and in response decreasing the target temperature, or determining that the first die has not exceeded the first temperature limit for longer than the duration of time, and in response increasing the target temperature.

9. The method of claim 8, further comprising:

controlling a cooling element for the first die, based on the target temperature.

10. The method of claim 8, wherein determining the target temperature based on the duration of time at which the first die has exceeded the first temperature limit comprises determining that the first die has exceeded the first temperature limit for longer than a duration of time, and in response decreasing the target temperature, the method further comprising:

transitioning control logic for the element from a first state to a second state, comprising:

the decreasing the target temperature, wherein the adjusting the volume of controller traffic transmitted from the second die to the first die is configured to maintain the first die at or below the decreased target temperature.

11. The method of claim 8, wherein determining the target temperature based on the duration of time at which the first die has exceeded the first temperature limit comprises determining that the first die has not exceeded the first temperature limit for longer than the duration of time, and in response increasing the target temperature, the method further comprising:

transitioning control logic for the element from a first state to a second state, comprising:

the increasing the target temperature, wherein the adjusting the volume of controller traffic transmitted from the second die to the first die is configured to maintain the first die at or below the increased target temperature.

12. The method of claim 7, wherein the duration of time relates to a portion of operating life at which the first die is recommended to operate above the first temperature limit.

13. A system, comprising:

an element comprising a first die and a second die, wherein:

the second die comprises at least a portion of a controller, the element comprises a co-packaged die, the first die comprises a memory comprising a plurality of stacked memory dies, and the controller comprises an integrated circuit (IC) comprising one or more dies; and a memory storing a program, which, when executed on a processor, performs an operation, the operation comprising:

measuring a temperature of the first die; and adjusting a volume of controller traffic transmitted from the second die to the first die to change the temperature of the first die, wherein the adjusting is based on: (i) a target temperature for the first die; (ii) the measured temperature for the first die; and (iii) an amount of activity at the memory.

14. The system of claim 13, wherein the element relates to at least one of a communication network router or switch, and wherein the memory comprises a high bandwidth memory (HBM).

15. The system of claim 13, the operation further comprising:

determining the target temperature based on a duration of time at which the first die has exceeded a first temperature limit, comprising at least one of:

determining that the first die has exceeded the first temperature limit for longer than a duration of time, and in response decreasing the target temperature, or determining that the first die has not exceeded the first temperature limit for longer than the duration of time, and in response increasing the target temperature.

16. A method, comprising:

measuring a temperature of a first die, in an element comprising the first die and a second die, wherein:

the second die comprises at least a portion of a controller, the element comprises a co-packaged die, the first die comprises a memory comprising a plurality of stacked memory dies, and the controller comprises an integrated circuit (IC) comprising one or more dies;

determining an activity level from the second die to the first die; and controlling a cooling element for the first die, based on the measured temperature of the first die and the activity level from the second die to the first die.

17. The method of claim 16, wherein controlling the cooling element for the first die comprises:

increasing cooling from the cooling element to allow the first die room for additional future traffic allocation from the second die.

18. The method of claim 16, further comprising:

changing the temperature of the first die by adjusting activity, from the second die to the first die, based on a target temperature for the first die and the measured temperature for the first die.

19. The method of claim 18, wherein the element relates to at least one of a communication network router or switch, and wherein the memory comprises a high bandwidth memory (HBM).

* * * * *